(12) United States Patent
Hamada et al.

(10) Patent No.: US 11,749,873 B2
(45) Date of Patent: Sep. 5, 2023

(54) HIGH-FREQUENCY MODULE

(71) Applicant: Nippon Telegraph and Telephone Corporation, Tokyo (JP)

(72) Inventors: Hiroshi Hamada, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 230 days.

(21) Appl. No.: 17/312,046

(22) PCT Filed: Nov. 27, 2019

(86) PCT No.: PCT/JP2019/046371
§ 371 (c)(1),
(2) Date: Jun. 9, 2021

(87) PCT Pub. No.: WO2020/121815
PCT Pub. Date: Jun. 18, 2020

(65) Prior Publication Data
US 2022/0029259 A1  Jan. 27, 2022

(30) Foreign Application Priority Data

Dec. 11, 2018 (JP) ................................. 2018-231609

(51) Int. Cl.
*H01P 3/123* (2006.01)
*H01P 1/207* (2006.01)
(Continued)

(52) U.S. Cl.
CPC .............. *H01P 1/207* (2013.01); *H01P 1/211* (2013.01); *H01P 3/123* (2013.01); *H01P 7/06* (2013.01)

(58) Field of Classification Search
CPC ........ H01P 1/207; H01P 1/2088; H01P 1/209; H01P 1/211; H01P 1/212; H01P 1/222;
(Continued)

(56) References Cited

U.S. PATENT DOCUMENTS 3,058,072 A * 10/1962 Rizzi ....................... H01P 1/209
333/210

FOREIGN PATENT DOCUMENTS

JP   H02190001 A   7/1990
JP   2003008313 A   1/2003

OTHER PUBLICATIONS

Pablo Sato, et al., "Analysis, Design, and Experimental Verification of Microwave Filters for Safety Issues in Open-Ended Waveguide Systems," IEEE Transactions on Microwave Theory and Techniques, vol. 48, No. 11, Nov. 2000, pp. 2133-2140.
(Continued)

*Primary Examiner* — Stephen E. Jones
(74) *Attorney, Agent, or Firm* — Slater Matsil, LLP (57) ABSTRACT

A plurality of waveguide structures are loaded on a top surface opposed to a bottom surface of a metal case, on which a high-frequency circuit is mounted, a height, a width, and a length of each of the plurality of waveguide structures have dimensions corresponding to a quarter-wave of a cutoff frequency indicating a frequency band of a target electromagnetic wave to be blocked, and a width and a length of each of the plurality of waveguide structures have dimensions that allow only a high-frequency wave of a mode to propagate in the frequency band.

9 Claims, 7 Drawing Sheets (51) Int. Cl.
*H01P 7/06* (2006.01)
*H01P 1/211* (2006.01)

(58) Field of Classification Search
CPC .... H01P 7/06; H01P 7/065; H01P 3/12; H01P 3/121; H01P 3/122; H01P 3/123
See application file for complete search history.

(56) References Cited

OTHER PUBLICATIONS

Kosugi, et al., "120-GHz Tx/Rx Waveguide Modules for 1O-Gbit/s Wireless Link System," IEEE Compound Semiconductor Integrated Circuit Symposium, Nov. 12, 2006, pp. 25-28.

\* cited by examiner

HIGH-FREQUENCY MODULE

CROSS-REFERENCE TO RELATED APPLICATIONS

This application is a national phase entry of PCT Application No. PCT/JP2019/046371, filed on Nov. 27, 2019, which claims priority to Japanese Application No. 2018-231609, filed on Dec. 11, 2018, which applications are hereby incorporated herein by reference.

TECHNICAL FIELD

The present invention relates to a high-frequency module configuration technique about a configuration of a high-frequency module that houses a high-frequency circuit inside a metal case.

BACKGROUND

A metal case formed of a hollow rectangular box is typically used for a high-frequency module that houses a high-frequency circuit such as an electronic circuit for optical communication or an electronic circuit for millimeter-wave band radio communication. At this time, unwanted propagation of electromagnetic waves within the metal case often causes problems. In many cases, the unwanted propagation of electromagnetic waves is caused by radiation from the circuit. That is, electromagnetic waves propagating through the high-frequency circuit are radiated from the high-frequency circuit and coupled to a mode propagating in space. The reason for this is as follows: the wavelength is short in the high-frequency band, and the size of circuitry such as an input/output pad for a high-frequency signal or a wide transmission line becomes almost the same as the wavelength of the high-frequency signal, so that the transmission medium functions as a radiator. There is also radiation in impedance discontinuous portions of the circuit and module. A part of a connection loss in a connection portion between a coaxial line or a waveguide, which is an interface of the metal case, and the high-frequency circuit is radiated into space, which is a typical example of radiation generated by impedance mismatch.

Electromagnetic waves radiated from the circuit in the metal case propagate between a metal pattern on the surface of the high-frequency circuit and the top surface of the metal case (the surface opposed to the surface of the high-frequency circuit). Because the side surfaces of the metal case act as reflective walls for this propagation mode, a resonator is formed in the metal case. As a result, resonance determined by the physical size of the metal case occurs, causing defects such as unwanted ripples in frequency characteristics of the high-frequency module. In particular, when a circuit component mounted on the high-frequency module is an amplification element such as an amplifier, unwanted ripples may be emphasized due to an amplification function of the amplifier. In addition, input/output terminals of the amplifier may be coupled by radiated electromagnetic waves to oscillate the amplifier.

A technology for using a radio wave absorber to block unwanted electromagnetic waves propagating in a metal case has been proposed (see, for example, Non Patent Literature 1). In this case, for example, a low-resistance doped silicon substrate is used as the radio wave absorber. By disposing the radio wave absorber on the top surface or the side surface of the metal case, a propagating unwanted mode is absorbed to suppress the occurrence of the above-mentioned defects.

CITATION LIST

Non Patent Literature

Non Patent Literature 1: Toshihiko KOSUGI et al., "120-GHz Tx/Rx Waveguide Modules for 10-Gbit/s Wireless Link System", Compound Semiconductor Integrated Circuit Symposium, 2006. CSIC 2006. IEEE, IEEE, December 2006.

SUMMARY

Technical Problem

However, according to such related art, it is necessary to dispose the radio wave absorber on the top surface or the side surface of the metal case. To this end, processes such as machining of the radio wave absorber in accordance with the internal structure of the metal case and the mounting of the radio wave absorber within the narrow metal case are required. As a result, there has been a problem in that work loads and work costs increase in the manufacturing of the high-frequency module.

Embodiments of the present invention have been devised to solve such a problem, and an object of embodiments of the present invention is to provide a high-frequency module configuration technology that can block unwanted electromagnetic waves propagating inside a metal case without using a radio wave absorber.

Means for Solving the Problem

To attain the above-mentioned object, a high-frequency module according to embodiments of the present invention includes: a metal case formed of a hollow rectangular box, the metal case being configured to house a high-frequency circuit in an interior space; and a plurality of waveguide structures loaded on a top surface opposed to a bottom surface of the metal case, the high-frequency circuit being mounted on the bottom surface, a height of each of the plurality of waveguide structures has a dimension corresponding to a quarter-wave of a cutoff frequency indicating a frequency band of a target electromagnetic wave to be blocked, and a width and a length of each of the plurality of waveguide structures have dimensions that allow only a high-frequency wave of a $TE_{10}$ mode to propagate in the frequency band.

Furthermore, in an example of the configuration of the high-frequency module according to embodiments of the present invention, the plurality of waveguide structures are loaded on the top surface in a row at a smaller interval than the quarter-wave along a second direction orthogonal to a first direction in which the target electromagnetic wave propagates.

Further, in an example of the configuration of the high-frequency module according to embodiments of the present invention, the plurality of waveguide structures are loaded on the top surface in an array at a smaller interval than the quarter-wave along a first direction in which the target electromagnetic wave propagates and a second direction orthogonal to the first direction.

In addition, in an example of the high-frequency module according to embodiments of the present invention, the plurality of waveguide structures arranged in each row along the second direction have a height corresponding to a quarter-wave of an individual cutoff frequency.

Effects of Embodiments of the Invention

According to embodiments of the present invention, electromagnetic wave propagating between ports and electromagnetic waves propagating through the respective waveguide structures cancel each other. Therefore, unwanted electromagnetic waves propagating the inside can be blocked without using a radio wave absorber. Therefore, it is possible to suppress an increase in work loads and work costs in manufacturing of the high-frequency module.

DETAILED DESCRIPTION OF ILLUSTRATIVE EMBODIMENTS

Principles of Embodiments of the Invention

Figure 1:
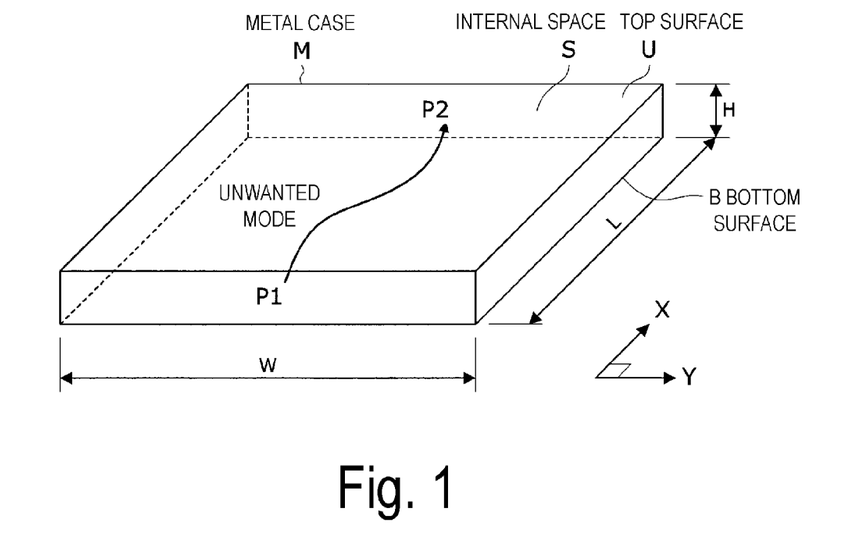
FIG. 1 is an explanatory diagram illustrating a calculation model of an unwanted mode.

First, the principle of embodiments of the present invention will be described. FIG. 1 is an explanatory diagram illustrating a calculation model of an unwanted mode. To describe the propagation of a leakage mode within a metal case M of a high-frequency module, an internal space S of the metal case M is assumed as a calculation model of the unwanted mode (primary transmission mode) as illustrated in FIG. 1. It is assumed that the high-frequency module (not illustrated) is mounted on a bottom surface B of the metal case M in the internal space S, and the outside of the metal case M is completely surrounded with a perfect conductor. Note that because the wall surface of the metal case M is not formed from a perfect conductor in the actual high-frequency module, the present calculation model is under more strict conditions and the leakage mode is more prone to propagate than practical. Thus, it is sufficient for practical use as long as the leakage mode can be blocked in this calculation model.

Figure 2:
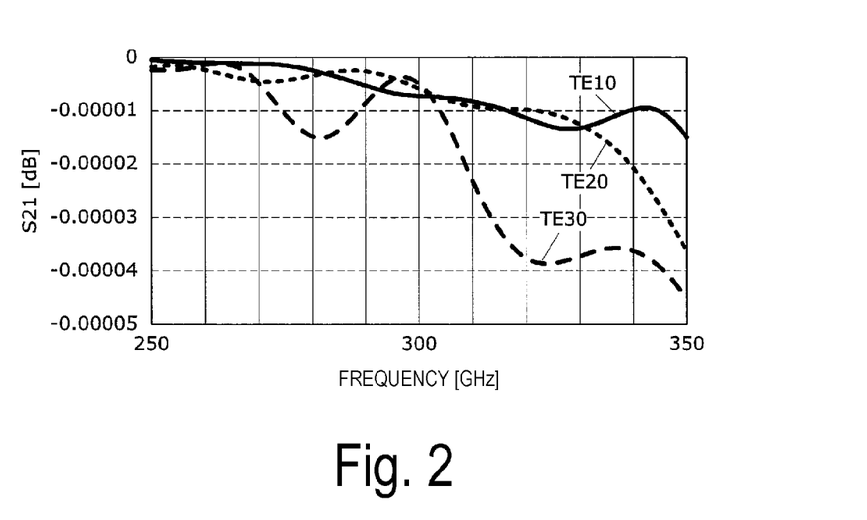
FIG. 2 is a graph illustrating propagation characteristics of the unwanted mode in FIG. 1.

FIG. 2 is a graph illustrating propagation characteristics of the unwanted modes in FIG. 1. As for the propagation characteristics of the mode propagating from a port P1 to a port P2 located on a pair of opposing side surfaces of the internal space S in FIG. 1, all of the modes $TE_{10}$, $TE_{20}$ and $TE_{30}$ propagate almost without loss, as illustrated in FIG. 2. It is believed that actually propagating modes are not limited to the three modes, and more modes determined depending on the wavelength of electromagnetic waves and the internal structure of the metal case M propagate. It is assumed that the internal space S has a width W of 2000 μm, a length L of 4000 μm, and a height H of 150 μm.

Figure 3:
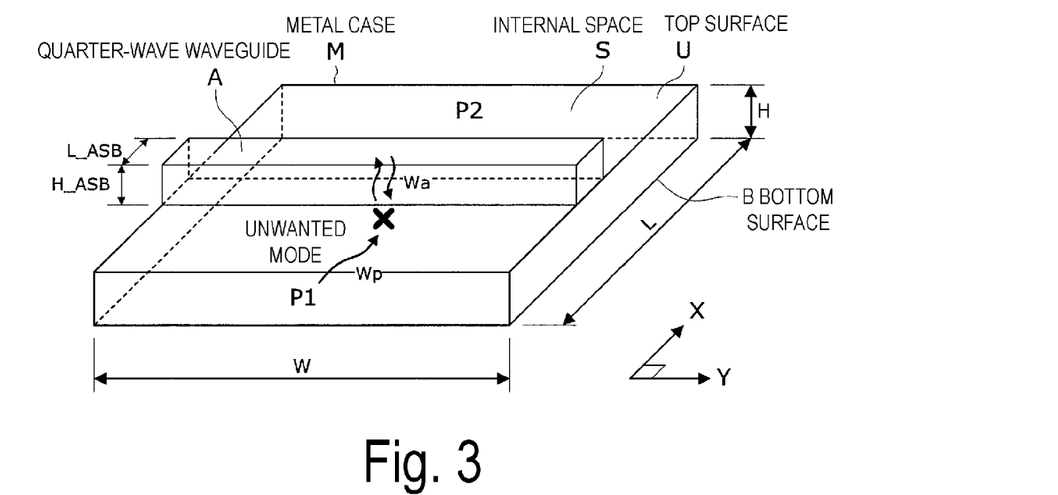
FIG. 3 is an explanatory diagram illustrating a structural example of a high-frequency module loaded with a quarter-wave waveguide.

FIG. 3 is an explanatory diagram illustrating a structural example of a high-frequency module loaded with a quarter-wave waveguide. Consider the internal structure of the metal case M that blocks the leakage modes illustrated in FIG. 2. In the structural example in FIG. 3, a quarter-wave waveguide A formed of a stub waveguide is loaded on a top surface U of the metal case M. This structure uses, as a choke structure, a technique for blocking leakage of electromagnetic waves at a connection portion between waveguide flanges.

As illustrated in FIG. 3, a phase difference between an electromagnetic wave WS that propagates to the quarter-wave waveguide A, is reflected, and is returned and an electromagnetic wave WP that propagates from the port P1 to the port P2 is 180 degrees. Thus, in a portion x in FIG. 3, the electromagnetic wave WS and the electromagnetic wave WP cancel each other, thereby achieving an effect of blocking the electromagnetic wave WP propagating from the port P1 to the port P2.

Figure 4:
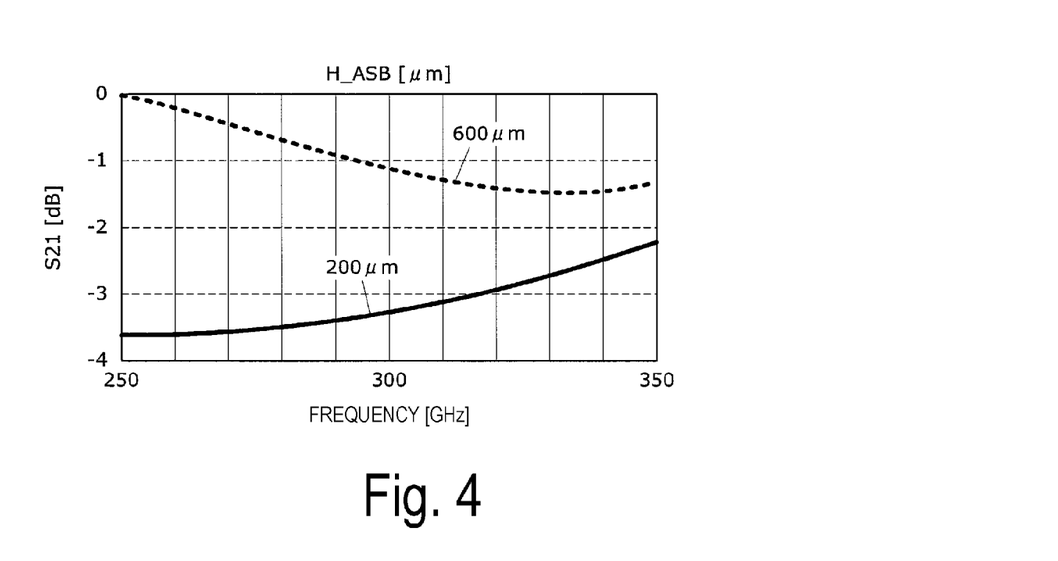
FIG. 4 is a graph illustrating passage characteristics of an electromagnetic wave between ports in FIG. 3.

However, such a technique commonly used in a choke flange or the like cannot achieve a satisfactory blocking effect. FIG. 4 illustrates passage characteristics of electromagnetic waves between the ports in FIG. 3. FIG. 4 illustrates passage characteristics of the electromagnetic waves from the port P1 to the port P2 (only $TE_{10}$ mode is input to the port P1). As compared with FIG. 2, it can be seen that the blocking effect (amount of reduction in S21) of approximately 4 dB at most can be obtained. In typical blocking by the quarter-wave path, signals cancel each other at frequencies where the phase difference between the electromagnetic waves is 180 degrees and ideally, leakage should be completely blocked. Thus, it is found out that the blocking effect in FIG. 3 is small.

In addition, as apparent from FIG. 4, even when a length H_ABS of the quarter-wave waveguide for blocking is largely changed to 200 μm or 600 μm, a clear blocking peak does not appear in the passage characteristics. This is because the quarter-wave waveguide A in FIG. 3 is not a single mode waveguide.

This will be described below in more detail. Even when only the $TE_{10}$ mode is input to the port P1, multi-modes such as $TE_{20}$, $TE_{30}$, . . . are excited in an impedance discontinuity between the quarter-wave waveguide A and the connection portion. Here, noting that different modes generally have different propagation constants, even when the quarter-wave waveguide A is set to have for example a length of the quarter-wave for the $TE_{10}$ mode, the quarter-wave waveguide A is not set to have a length of the quarter-wave for the other modes. For such modes, the effect of canceling electromagnetic waves at the portion x in FIG. 3 cannot be expected. Therefore, in the structure in FIG. 3, a large blocking effect cannot be achieved.

Figure 5:
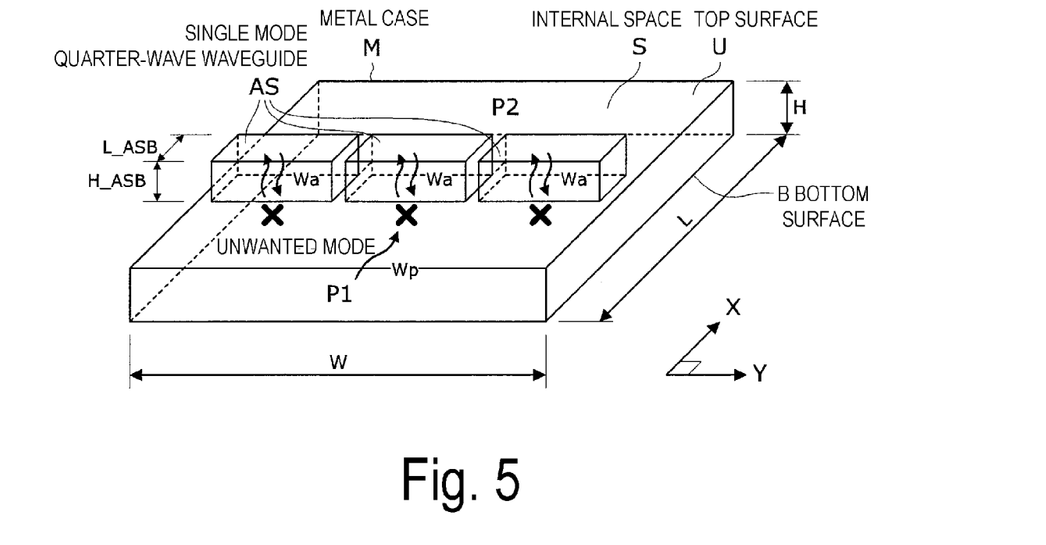
FIG. 5 is an explanatory diagram illustrating a structural example of a module loaded with a plurality of single-mode quarter-wave waveguides.

Therefore, according to embodiments of the present invention, a structure is proposed in which the quarter-wave waveguide A in FIG. 3 is divided into small quarter-wave waveguides AS, and only the single mode ($TE_{10}$ mode) can propagate through each of the quarter-wave waveguides AS. FIG. 5 is an explanatory diagram illustrating an structural example of a module loaded with a plurality of single mode quarter-wave waveguides.

Generally, the number of propagating modes of the waveguide can be limited by limiting its size. In the example in FIG. 5, by limiting the width and the length of each quarter-wave waveguide AS, the quarter-wave waveguide AS propagates a single mode. The width and the length of each quarter-wave waveguide AS are set to be a quarter-wave in the $TE_{10}$ mode.

That is, the height of each quarter-wave waveguide AS has a dimension corresponding to the quarter-wave of a cutoff frequency indicating a frequency band of a target electromagnetic wave to be blocked. The width and length of each quarter-wave waveguide AS have dimensions that allow only a high-frequency wave of the $TE_{10}$ mode to propagate in the frequency band of the target electromagnetic wave.

With such a structure, the electromagnetic waves propagating from the port P1 to the port P2 and the electromagnetic waves propagating through the quarter-wave waveguides AS completely cancel each other at portions x in FIG. 5, achieving a large blocking effect.

Embodiments of the present invention will be described below with reference to the drawings.

First Embodiment

Figure 6:
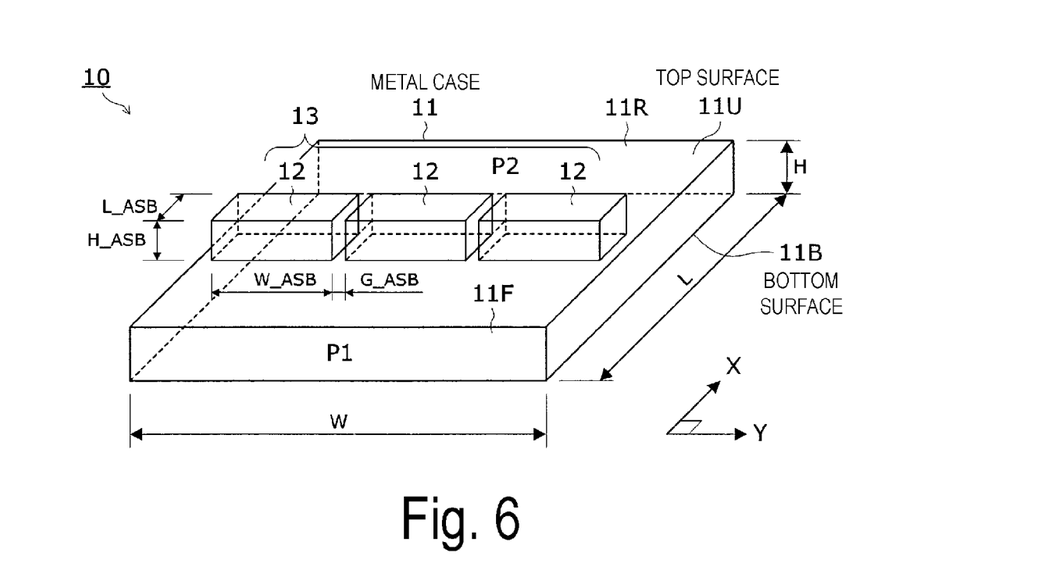
FIG. 6 is a perspective view illustrating a high-frequency module according to a first embodiment.
Figure 7:
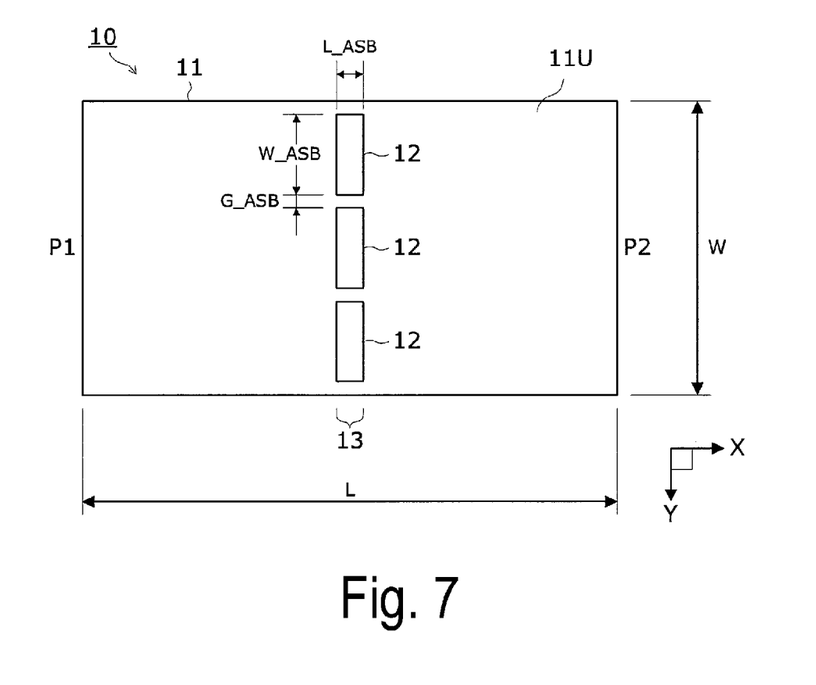
FIG. 7 is a top view illustrating the high-frequency module according to the first embodiment.
Figure 8:
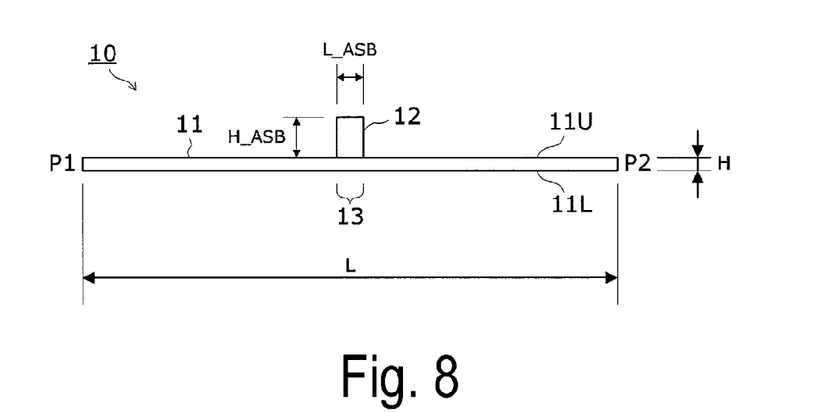
FIG. 8 is a side view illustrating the high-frequency module according to the first embodiment.

First, with reference to FIGS. 6 to 8, a high-frequency module 10 according to a first embodiment of the present invention will be described. FIG. 6 is a perspective view illustrating the high-frequency module according to the first embodiment. FIG. 7 is a top view illustrating the high-frequency module according to the first embodiment. FIG. 8 is a side view illustrating the high-frequency module according to the first embodiment.

This high-frequency module 10 is a module that houses a high-frequency circuit inside a metal case. In the present embodiment, a specific example of the structure described in the principle of embodiments of the present invention will be described.

As illustrated in FIGS. 6 to 8, the high-frequency module 10 according to the present embodiment is formed of a hollow rectangular box, and includes a metal case 11 that houses a high-frequency circuit in an interior space, and a plurality of waveguide structures 12 formed of quarter-wave waveguides AS in FIG. 5 loaded on a top surface 11U opposed to a bottom surface 11B of the metal case 11, on which the high-frequency circuit is mounted (a high-frequency circuit surface on which a metal pattern of the high-frequency circuit is formed).

In the present embodiment, a height H_ABS of each of the waveguide structures 12 has a dimension corresponding to the quarter-wave of a cutoff frequency fo indicating a frequency band of a target electromagnetic wave to be blocked. In addition, a width W_ABS and a length L_ABS of each of the waveguide structures 12 have dimensions that allow only a high-frequency wave in the $TE_{10}$ mode to propagate in the frequency band of the target electromagnetic wave.

Further, the waveguide structures 12 are arranged in a row at smaller intervals than the quarter-wave of the cutoff frequency fo along a second direction Y orthogonal to a first direction X in which a pair of ports P1 and P2 located on a pair of side surfaces 11F and 11R of the metal case 11.

Hereinafter, the structure in which the plurality of waveguide structures 12 are arranged in a row along the second direction Y is referred to as a blocking structure 13. Although FIGS. 6 to 8 illustrate an example in which the blocking structure 13 includes three waveguide structures 12, the number of waveguide structures 12 is not limited to three, and it is only required that the number of waveguide structures 12 be two or more. The actual number of the waveguide structures is determined based on the width W of the high-frequency module 10 along the second direction Y, and the size and the interval of the waveguide structures 12.

The height H_ABS of the waveguide structure 12 is set to be the quarter-wave of the cutoff frequency fo, as previously described. As a result, the waveguide structure 12 serves as a single-mode quarter-wave waveguide. In addition, the width W_ABS of the waveguide structure 12 along the second direction Y and the length L_ABS of the waveguide structure 12 along the first direction X are parameters for determining the cutoff frequency fo. For example, when it is desired to block leaked electromagnetic waves in the 300 GHz band, W_ABS and L_ABS are determined such that only the $TE_{10}$ mode propagates through the waveguide structures 12 in the 300 GHz band. Here, as an example of the parameters, W_ABS is set to 630 μm and L_ABS is set to 430 μm. The relationship between the quarter-wave of the cutoff frequency fo, and the W_ABS and the L_ABS is determined based on a common, publicly known calculation technique.

As an interval G_ABS between the waveguide structures 12 along the second direction Y becomes smaller, the target electromagnetic wave propagating from the port 1 to the port P2 can be coupled to the waveguide structures 12 more reliably without loss, achieving a large blocking effect. At this time, G_ABS is desirably a value less than the quarter-wave of the cutoff frequency fo so as not to produce resonance at the interval between the waveguide structures 12. Thus, a minimum dimension (generally, approximately 50 to 100 μm) of machining accuracy at the time of machining the metal case 11 is selected as G_ABS. Here, G_ABS is set to 50 μm.

Figure 9:
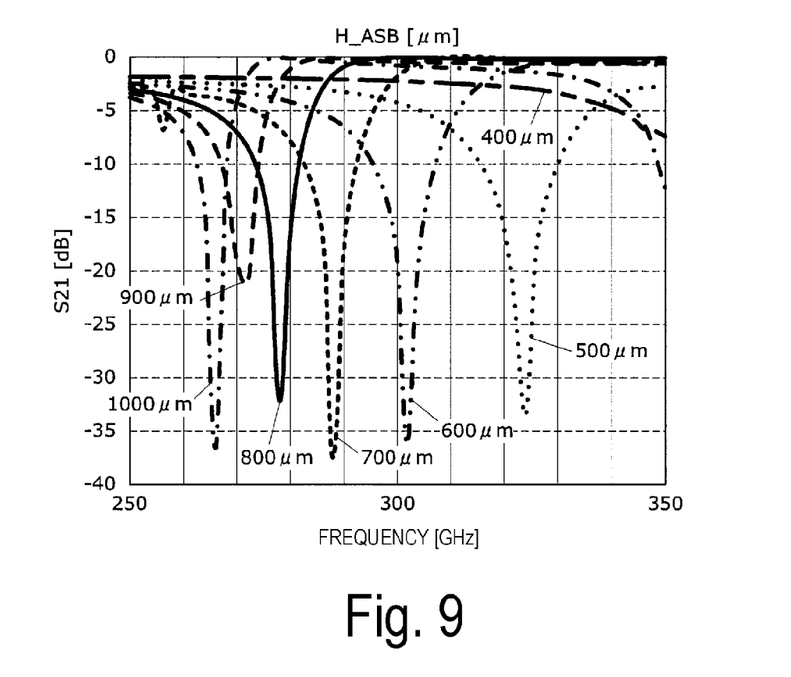
FIG. 9 is a graph illustrating passage characteristics of the high-frequency module according to the first embodiment.

FIG. 9 is a graph illustrating passage characteristics of the high-frequency module according to the first embodiment and illustrating the passage characteristics of electromagnetic waves propagating from the port P1 to the port P2. It can be seen that a very large blocking effect is exerted, such as a blocking amount of 35 dB at 302 GHz, when the height H_ABS of the waveguide structure 12 is 600 μm. It can also be seen that the frequency band for achieving a large blocking effect can be changed by adjusting the length L_ABS of the waveguide structure 12. As compared with the case of using the typical choke structure described above with reference to FIG. 4, a much larger amount of attenuation can be obtained in the present embodiment. Thus, the effectiveness of the present embodiment can be confirmed.

Furthermore, as described in the principle of embodiments of the present invention, embodiments of the present invention do not require a radio wave absorber, and the waveguide structures 12 can be loaded by simply machining the wall surface of the metal case 11 to change the shape of the metal case. Therefore, it is possible to suppress an increase in work loads and work costs in manufacturing of the high-frequency module.

Second Embodiment

Figure 10:
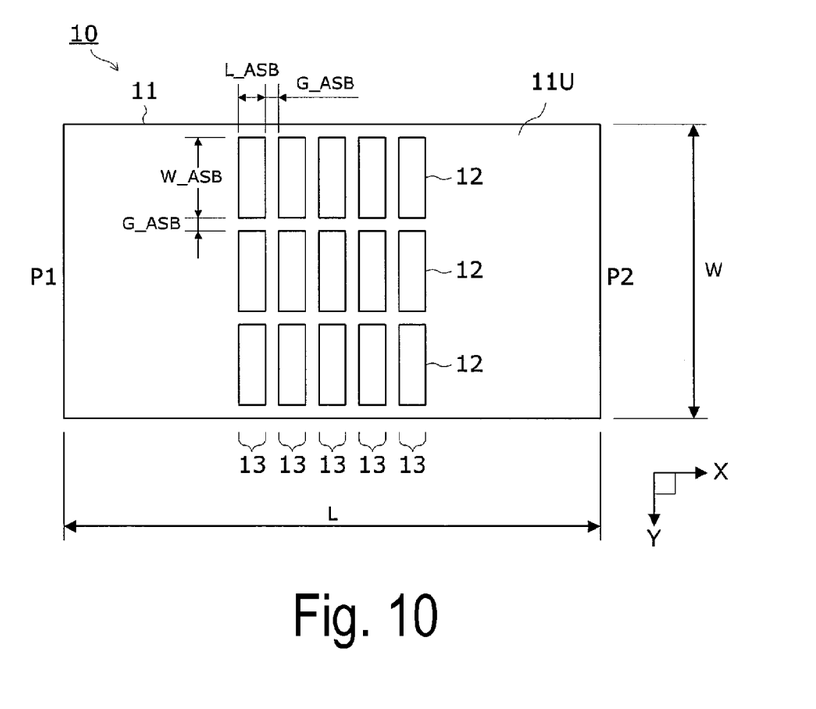
FIG. 10 is a top view illustrating a high-frequency module according to a second embodiment.
Figure 11:
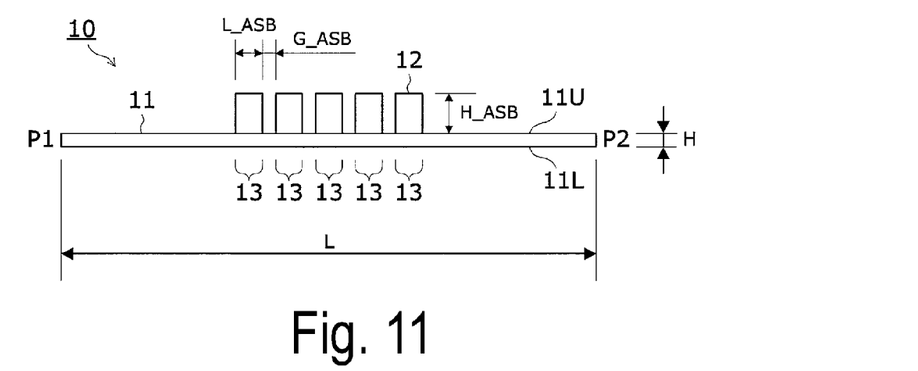
FIG. 11 is a side view illustrating the high-frequency module according to the second embodiment.

Next, a high-frequency module 10 according to a second embodiment of the present invention will be described with reference to FIGS. 10 and 11. FIG. 10 is a top view illustrating the high-frequency module according to the second embodiment. FIG. 11 is a side view illustrating the high-frequency module according to the second embodiment.

In the present embodiment, a configuration is described in which the blocking structures 13 described in the first embodiment are disposed in multiple stages along the first direction X.

With the waveguide structures 12, electromagnetic waves can be superposed with a phase difference of 180 degrees and therefore, the amount of attenuation is ideally infinite. However, as described in the first embodiment, due to the gap of the interval G_ABS having a finite length, a part of the electromagnetic wave propagating from the port P1 to the port P2 is not coupled to the quarter-wave and becomes a leakage signal as it is. For this reason, the amount of attenuation is not infinite. In addition, strictly speaking, because the frequency that has the quarter-wave is only a single frequency, a large amount of attenuation cannot be obtained at frequencies outside of this frequency, and in the structure in FIGS. 6 to 8, only narrow band attenuation characteristics as illustrated in FIG. 9 can be obtained.

Thus, the present embodiment proposes a structure that achieves a larger amount of attenuation and a larger attenuation band by disposing the blocking structures 13 illustrated in FIGS. 6 to 8 in multiple stages along the electromagnetic wave propagation direction, that is, the first direction X.

With the blocking structures 13 in multiple stages, characteristics obtained by multiplying the attenuation characteristic in FIG. 9 by the number of stages can be achieved to increase the amount of attenuation. In addition, at a section having an intermediate amount of attenuation around the attenuation peak in FIG. 9, by multiplying the characteristic by the number of multiple stages, the amount of attenuation increases, and as a result, the band where a large amount of attenuation can be obtained also widens.

As illustrated in FIGS. 10 and 11, the high-frequency module 10 according to the present embodiment is formed of a hollow rectangular box, and includes a metal case 11, a pair of high-frequency input/output ports P1 and P2, and a plurality of waveguide structures 12. The metal case 11 houses a high-frequency circuit in an interior space. The pair of high-frequency input/output ports P1 and P2 are provided on side surfaces 11F and 11R of the metal case 11, respectively, which are opposed to each other along the first direction X. The plurality of waveguide structures 12 are formed of stub waveguides and loaded on a top surface 11U opposed to a bottom surface 11B of the metal case 11, on which the high-frequency circuit is mounted.

Similar to the first embodiment, the height H_ABS of each of the waveguide structures 12 has a dimension corresponding to the quarter-wave of a cutoff frequency fo indicating a frequency band of a target electromagnetic wave to be blocked. In addition, a width W_ABS and a length L_ABS of each of the waveguide structures 12 have dimensions that allow only a high-frequency wave in the $TE_{10}$ mode to propagate in the frequency band of the target electromagnetic wave. In addition, the waveguide structures 12 are loaded in an array along the first direction X and the second direction Y at smaller intervals than quarter-wave of the high-frequency wave of the $TE_{10}$ mode.

Although FIGS. 10 and 11 illustrate the example in which the blocking structure 13 includes three waveguide structures 12, the number of waveguide structures 12 disposed along the second direction Y is not limited to three, and it is only required that the number of waveguide structures 12 be two or more. The actual number of the waveguide structures is determined based on the width W of the high-frequency module 10 along the second direction Y, and the size and the interval of the waveguide structures 12. Moreover, the number of stages of the blocking structures 13 along the first direction X is determined by the number of electromagnetic waves to be superposed.

In FIGS. 10 and 11, the size of each of the waveguide structures 12 is the same as that in FIGS. 6 to 8. As the height H_ABS of each waveguide structure 12, 600 µm that achieves a large amount of attenuation in the vicinity of 300 GHz is commonly selected. In addition, for the same reason as that in the first embodiment, the interval G-ABS between the waveguides disposed in multiple stage is preferably as small as possible. Thus, in the same manner as in the first embodiment, the minimum dimension of machining of the metal case (generally, approximately 50 to 100 µm) may be selected. Here, G_ABS is set to 50 µm. In addition, the number of stages is set to five.

Figure 12:
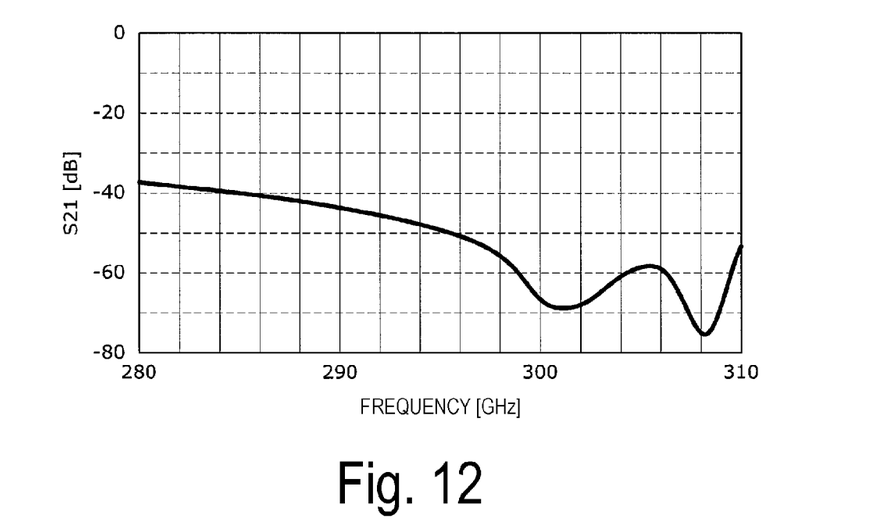
FIG. 12 is a graph illustrating passage characteristics of the high-frequency module according to the second embodiment.

FIG. 12 is a graph illustrating passage characteristics of the high-frequency module according to the second embodiment and illustrating the passage characteristics of electromagnetic waves propagating from the port P1 to the port P2. It can be seen that a very large amount of attenuation of 65 dB or more is obtained at 300 GHz. In addition, a large amount of attenuation of 40 dB is obtained also at 285 GHz, which indicates the effects of increasing the amount of attenuation and the band in the present embodiment.

Despite the very large amount of attenuation, the total length of the structure (length for five stages in the propagation direction) is as small as 2350 µm. If it is attempted to obtain the amount of attenuation of 40 dB using a radio wave absorber, an object having an amount of attenuation of 20 dB/mm or more needs to be used. Because it is difficult to obtain such a large amount of attenuation by using a typical radio wave absorber such as doped Si, it can be understood that the effect of blocking electromagnetic waves of embodiments of the present invention is very high.

Third Embodiment

Figure 13:
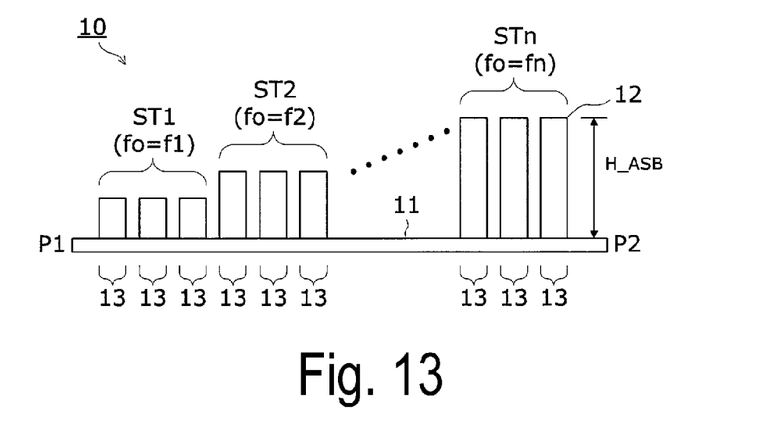
FIG. 13 is a side view illustrating a high-frequency module according to a third embodiment.

Next, a high-frequency module 10 according to a third embodiment of the present invention will be described with reference to FIG. 13. FIG. 13 is a side view of the high-frequency module according to the third embodiment.

The present embodiment describes a technique for widening a blocking band.

As illustrated in FIG. 13, as in the second embodiment, the high-frequency module 10 according to the present embodiment includes blocking structures 13 arranged along the first direction X on a top surface 11U of a metal case 11. In FIG. 13, a blocking structural body STk (k=1, 2, ..., n) includes blocking structures 13 according to the first or second embodiment in one or more stages, and for the blocking structures 13 belonging to the same blocking structural body STk, a center frequency of the same blocking band is set to fk.

As previously described, the center frequency fk of the blocking band is determined by the height H_ABS of each of the waveguide structures 12 configuring the blocking structure 13. That is, the waveguide structures 12 arranged in each row along the second direction Y have a height corresponding to the quarter-wave of an individual cutoff frequency fo. Note that, similar to the first and second embodiments, the width W_ABS and the length L_ABS of each of the waveguide structures 12 have dimensions that allow only a high-frequency wave in the $TE_{10}$ mode to propagate in the frequency band of the target electromagnetic wave.

Figure 14:
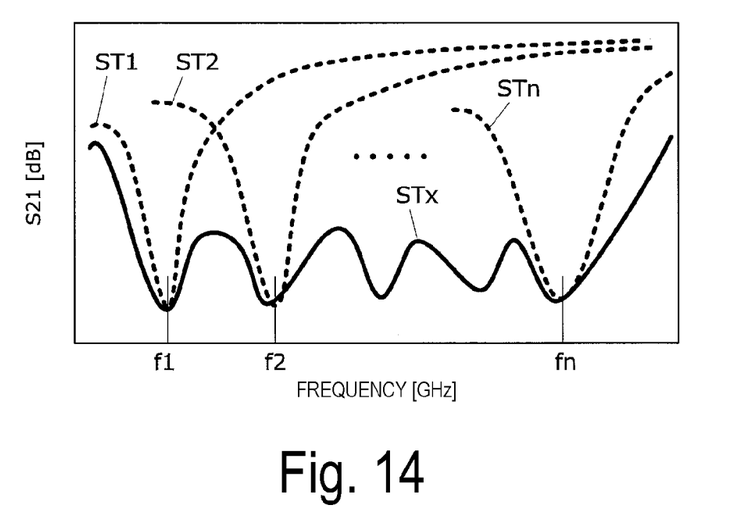
FIG. 14 is a graph illustrating passage characteristics of the high-frequency module according to the third embodiment.

FIG. 14 is a graph illustrating passage characteristics of the high-frequency module according to the third embodiment and illustrating the passage characteristics of electromagnetic waves propagating from the port P1 to the poll P2. With such a configuration, blocking bands having the center frequencies f1, f2, . . . , fN are formed for the electromagnetic waves propagating from the port P1 to the poll P2. Thus, as a whole, as illustrated in FIG. 14, the configuration in FIG. 13 exhibits a wide-band blocking characteristic STx obtained by overlapping blocking characteristics of the center frequencies f1, f2, . . . , fN.

It is possible to obtain a band blocking characteristic of the present embodiment wider than those in the first and second embodiments. Therefore, for example, embodiments of the present invention can be applied to a high-frequency module for mounting a wide band amplifier such as a distribution amplifier, and can block electromagnetic waves leaked due to out-of-band oscillation of the amplifier, thereby achieving a highly versatile electromagnetic wave blocking structure.

Expansion of Embodiment

The present invention has been described above with reference to the embodiments, but the present invention is not limited to the above-described embodiments. Various changes understood by a person skilled in the art within the scope of the present invention can be made to the configurations and details of the present invention. Furthermore, the embodiments can be freely combined within a range where no inconsistency occurs.

REFERENCE SIGNS LIST

10 High-frequency module
11 Metal case
11F, 11R Side surface
11B Bottom surface
11U Top surface
12 Waveguide structure
13 Blocking structure
STk Blocking structural body
P1, P2 Port.

The invention claimed is:

1. A high-frequency module comprising:
a metal case including a hollow rectangular box, the metal case being configured to house a high-frequency circuit in an interior space of the hollow rectangular box; and
a plurality of waveguide structures on a top surface of the metal case, the top surface of the metal case being opposed to the interior space and disposed over a bottom surface of the metal case, the bottom surface of the metal case being configured to attach the high-frequency circuit, wherein a height of each of the plurality of waveguide structures has a dimension corresponding to a quarter-wave of a cutoff frequency indicating a frequency band of a target electromagnetic wave to be blocked, and wherein a width and a length of each of the plurality of waveguide structures have dimensions that allow only a high-frequency wave of a $TE_{10}$ mode to propagate in the frequency band.

2. The high-frequency module according to claim 1, wherein
the plurality of waveguide structures are on the top surface in a row at a smaller interval than the quarter-wave along a second direction orthogonal to a first direction in which the target electromagnetic wave propagates.

3. The high-frequency module according to claim 1, wherein the plurality of waveguide structures are on the top surface in an array at a smaller interval than the quarter-wave along a first direction in which the target electromagnetic wave propagates and a second direction orthogonal to the first direction.

4. The high-frequency module according to claim 3, wherein the plurality of waveguide structures arranged in one or more rows of the array along the second direction have a height corresponding to a quarter-wave of an individual cutoff frequency.

5. A high-frequency module comprising:
a metal case including a hollow rectangular box;
a high-frequency circuit housed in an interior of the hollow rectangular box, wherein the high-frequency circuit is mounted to a first surface of the metal case; and
a plurality of waveguide structures on a second surface of the metal case opposite the interior of the hollow rectangular box and disposed above the first surface of the metal case, wherein a height of each of the plurality of waveguide structures has a dimension corresponding to a quarter-wave of a cutoff frequency indicating a frequency band of a target electromagnetic wave to be blocked.

6. The high-frequency module of claim 5, wherein a width and a length of each of the plurality of waveguide structures have dimensions that allow only a high-frequency wave of a $TE_{10}$ mode to propagate in the frequency band.

7. The high-frequency module of claim 5, wherein the plurality of waveguide structures are disposed in a row at a smaller interval than the quarter-wave along a second direction orthogonal to a first direction in which the target electromagnetic wave propagates.

8. The high-frequency module of claim 5, wherein the plurality of waveguide structures are disposed in an array at a smaller interval than the quarter-wave along a first direction in which the target electromagnetic wave propagates and a second direction orthogonal to the first direction.

9. The high-frequency module of claim 8, wherein the plurality of waveguide structures arranged in one or more rows of the array along the second direction have a height corresponding to a quarter-wave of an individual cutoff frequency.

* * * * *